United States Patent [19]

Lesmeister et al.

[11] Patent Number: 5,689,690

[45] Date of Patent: Nov. 18, 1997

[54] TIMING SIGNAL GENERATOR

[75] Inventors: Gary J. Lesmeister, Hayward, Calif.; Daniel J. Bedell, Portland, Oreg.

[73] Assignee: Credence Systems Corporation, Fremont, Calif.

[21] Appl. No.: 574,333

[22] Filed: Dec. 18, 1995

Related U.S. Application Data

[63] Continuation-in-part of Ser. No. 534,015, Sep. 25, 1995.

[51] Int. Cl.$^6$ ............................................. G06F 1/04
[52] U.S. Cl. ............................ 395/555; 327/291; 371/27
[58] Field of Search ............................................. 395/551, 552, 395/555, 556, 559, 183.01, 183.07, 183.08; 364/579, 580; 371/22.1, 27; 327/100, 152, 172, 231, 261, 291, 295

[56] References Cited

U.S. PATENT DOCUMENTS

| | | | |
|---|---|---|---|
| 4,231,104 | 10/1980 | St. Clair | 364/900 |
| 4,645,944 | 2/1987 | Uya | 307/243 |
| 4,709,173 | 11/1987 | Nishimichi et al. | 307/243 |
| 4,809,221 | 2/1989 | Magliocco et al. | 364/900 |
| 4,855,681 | 8/1989 | Millham | 328/62 |
| 4,928,278 | 5/1990 | Otsuji et al. | 371/1 |
| 5,164,612 | 11/1992 | Kaplinsky | 307/272.2 |
| 5,170,073 | 12/1992 | Hahn et al. | 307/270 |
| 5,189,319 | 2/1993 | Fung et al. | 307/452 |
| 5,212,443 | 5/1993 | West et al. | 324/158 R |
| 5,216,289 | 6/1993 | Hahn et al. | 307/270 |
| 5,274,796 | 12/1993 | Conner | 395/550 |
| 5,293,082 | 3/1994 | Bathaee | 307/270 |
| 5,319,258 | 6/1994 | Ruetz | 307/443 |
| 5,345,186 | 9/1994 | Lesmeister | 328/155 |
| 5,552,733 | 9/1996 | Lesmeister | 327/295 |

FOREIGN PATENT DOCUMENTS 60-261216 12/1985 Japan ............................ H03K 17/693

*Primary Examiner*—Dennis M. Butler
*Attorney, Agent, or Firm*—Smith-Hill and Bedell

[57] ABSTRACT

A timing signal generator includes a voltage controlled oscillator (VCO), a logic circuit, N set circuits and N reset circuits and a bistable latch circuit. The VCO produces a set of N reference signals frequency locked to a reference clock signal and distributed in phase so as to evenly resolve the reference clock period into N intervals. The logic circuit asserts ones of N set signals and N reset signals selected by input control words. Each set circuit receives one of the N set signals and one of the N reference signals and briefly couples an output node to high logic level source in response to a leading edge of the received reference signal when its received set signal is asserted. Each reset circuit receives one of the N reset signals and one of the N reference signals and briefly couples the output node to low logic level source in response to a leading edge of its received reference signal when it reset signal is asserted. The bistable circuit maintains the output node at its current logic level after the output node is decoupled from either of the sources. The timing of leading and trailing edges of pulses of the output timing signal may be controlled with a resolution that is 1/Nth of the period of the reference clock by supplying an appropriate control word sequence to the logic circuit.

20 Claims, 5 Drawing Sheets

TIMING SIGNAL GENERATOR

BACKGROUND OF THE INVENTION

This is a continuation-in-part of copending U.S. patent application Ser. No. 08/534,015, filed Sep. 25, 1995.

BACKGROUND OF THE INVENTION

1. Field of the Invention

The present invention relates to a circuit for producing an output signal pulse having leading and trailing edges precisely timed in relation to a reference clock signal.

2. Description of Related Art

Integrated circuit (IC) testers supply input test signal pulses to terminals of an IC under test and sample output signals produced by the IC at precisely controlled times. IC testers time such actions in response to pulses of input timing signals produced by timing signal generators. A typical prior art timing signal generator employs a stable, high frequency, clock signal source such a crystal oscillator to prove an accurate reference clock signal. The generator determines when to produce an output timing signal pulse by counting pulses of the reference clock signal. The resolution with which the timing signal generator can adjust the timing of its output signal pulses is limited to the period of the reference clock signal—the timing signal frequency can only be even multiples of the reference signal. However, as the speed of integrated circuits increases so too must the resolution of the timing signals employed by integrated circuit testers.

One solution to the problem of increasing the resolution of timing signals beyond the period of the reference clock signal is disclosed in U.S. Pat. No. 4,231,104 issued Oct. 28, 1980 to Richard P. St. Clair. St. Clair's signal generator also employs a counter to count pulses of an oscillator and to produce an output signal pulse when the count reaches a predetermined limit. However the counter output then passes through a delay line to become a generator output timing signal pulse. The delay of the delay line can be finely adjusted over a range that is smaller than the period of the oscillator. Thus the timing signal generator can adjust the timing of pulses of the output timing signal with resolution that is finer than the period of the reference clock signal. The frequency of the timing signal output can be uneven multiples of the reference clock signal input.

The St. Clair timing signal generator has two deficiencies. First, the generator requires relatively complicated and expensive "recirculating remainder" logic to control the delay of the delay line. Second, the delay line must be precisely calibrated and is expensive and difficult to manufacture.

What is needed is an inexpensive timing signal generator which can control the timing of output timing signal pulses with high resolution.

Summary of the Invention

In accordance with the present invention a timing signal generator includes a voltage controlled oscillator for producing a set of N reference signals frequency locked to a reference clock signal and distributed in phase so as to evenly resolve the reference clock period into N intervals. The timing signal generator responds to a sequence of control words wherein bits of each control word control assertion of a set of N set signals and a set of N reset signals, where N is greater than 1. The timing signal generator also includes N set circuits and N reset circuits. Each set circuit receives a separate one of the set signals and a separate one of the N reference signals. Each set circuit couples an output node to a high logic level source only when its received set and reference signals are concurrently asserted. Each reset circuit receives a separate one of the reset signals and a separate one of the N reference signals and couples the output node to a low logic level source only when its received reset and reference signals are concurrently asserted. A bistable circuit senses the logic level of the output node when the output node is connected to either of said the high or low logic level sources and maintains the output node at the last sensed logic level when the output node is no longer connected to either of the sources.

The timing signal output is generated at the output node. The set and reset signals select which reference signals are to control timing of leading and trailing edges of the output timing signal. By applying a new control word to the generator during each cycle of the clock signal, a user can control timing of leading and trailing edges of pulses of the output timing signal with a resolution that is 1/Nth of the period of the reference clock.

In accordance with another aspect of the invention, each set circuit includes a logic gate receiving one set signal and one reference signal and producing an output signal indicating when the received set and reference signals are concurrently asserted. The logic gate output controls a transistor selectively coupling the output node to the high logic level source. Each reset and circuit includes a logic gate receiving one reset signal and one reference signal and producing an output signal indicating when the received reset and reference signals are concurrently asserted. The reset circuit logic gate output controls a transistor selectively coupling the output node to the low logic level source.

It is accordingly an object of the invention to provide a method and apparatus for producing an output signal having pulses time referenced to pulses of a periodic reference clock signal and wherein the timing of the output signal pulses can be adjusted with a resolution that is finer than the period of the reference clock signal.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing wherein like reference characters refer to like elements.

DESCRIPTION OF THE PREFERRED EMBODIMENT

Figure 1:
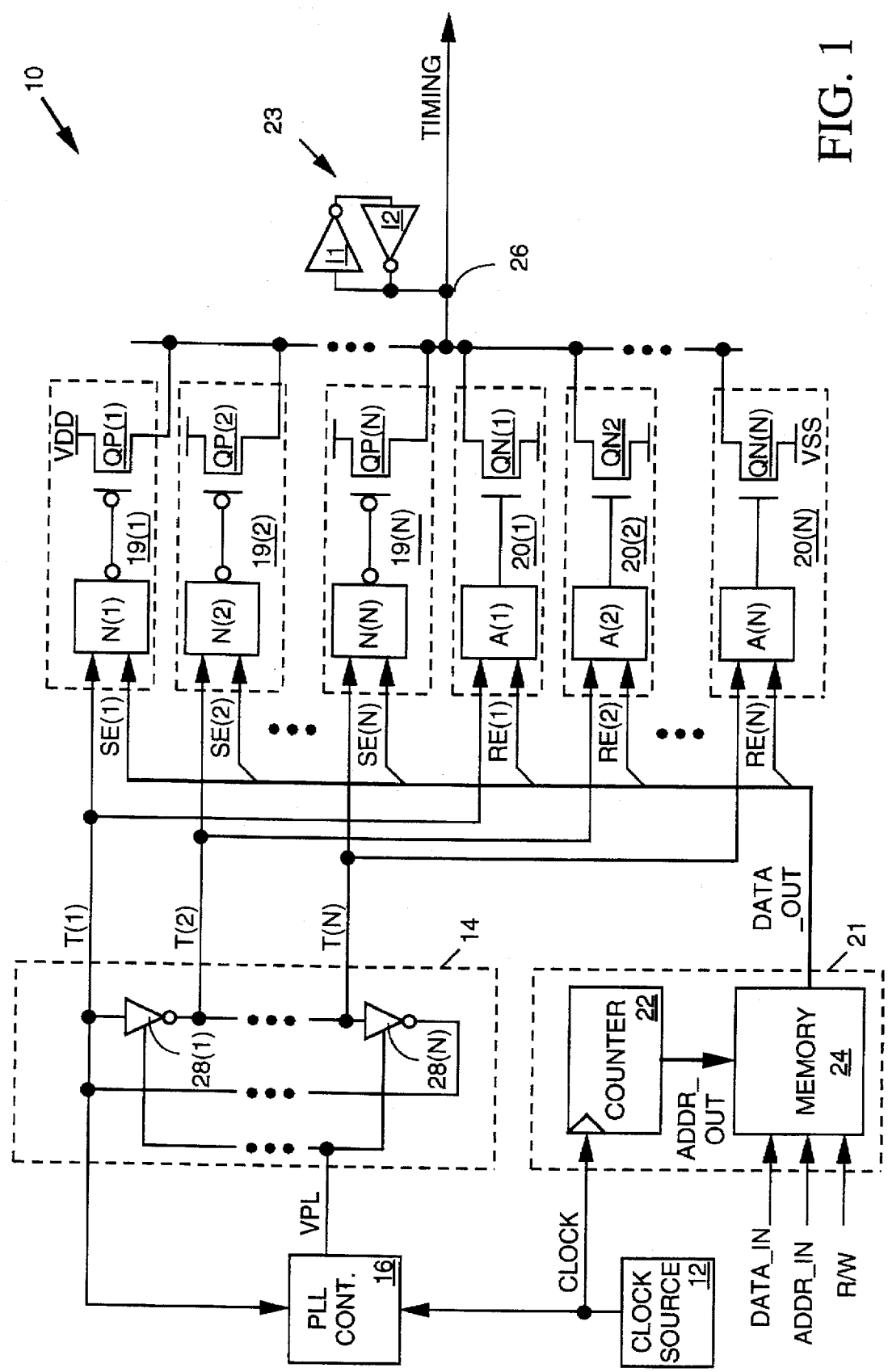
FIG. 1 illustrates in block diagram form a timing signal generator in accordance with a preferred embodiment of the present invention.

FIG. 1 illustrates in block diagram form a timing signal generator 10 in accordance with a preferred embodiment of the present invention. Generator 10 produces an output timing signal (TIMING) having an adjustable frequency that may be an integer or non-integer multiple of the frequency of a reference clock signal CLOCK produced by a clock signal source 12. Generator 10 includes clock signal source 12, a ring oscillator 14, a phase lock loop (PLL) controller 16, N set circuits 19(1)–19(N), N reset circuits 20(1)–20(N), a programmable logic circuit 21, and a bistable latch circuit 23. (N is an integer greater than one.)

Ring oscillator 14 produces a set of N output reference signals T(1)–T(N), each frequency locked to the CLOCK signal by a conventional phase lock loop (PLL) controller 16. Tap signals T(1)–T(N) are distributed in phase so that their leading edges evenly divide the period of the clock signal into N equal segments. Only reference signal T(1) is phase locked to the CLOCK signal.

Programmable logic circuit 21 repeatedly generates a sequence of output 2N-bit data words DATA_OUT. Logic circuit 21 receives the CLOCK signal and produces each output word of the DATA_OUT sequence in response to each pulse of the CLOCK signal. Each DATA_OUT word consists of a set N "set" bits SE(1)–SE(N) and a set of N "reset" bits RE(1)–RE(N). As discussed herein below, a user can load a desired data sequence into logic circuit 21 and logic circuit 21 will repeatedly generate that sequence at its output. The DATA_OUT sequence controls the nature of the output TIMING signal, including its phase, frequency and duty cycle.

Each set circuit 19(J) (where J is any integer from 1 through N) includes an inverting edge generator N(J) and a pmos transistor QP(J). Edge generator N(J) receives as input reference signal T(J) and DATA_OUT word bit SE(J). IF SE(J) is high, then on the leading edge of T(J), edge generator N(J) will produce a brief, negative-going output pulse. The output of edge generator N(J) drives the gate of transistor QP(J) having source and drain terminals coupled between a high logic level source VDD and output node 26. When asserted during any particular CLOCK cycle, set bit SE(J) tells the edge generator N(J) to briefly turn on transistor QP(J) on the leading edge of a T(J) pulse. Transistor QP(J) thereupon drives the TIMING signal to a high logic level.

Each reset circuit 20(J) includes a non-inverting edge generator A(J) and an nmos transistor QN(J). Edge generator A(J) receives reference signal T(J) and DATA_OUT word reset bit RE(J). The output of edge generator A(N) drives the gate of transistor QN(J) having source and drain terminals coupled between a low logic level source VSS and output node 26. When asserted during any particular CLOCK cycle, set bit RE(J) enables edge generator A(N). On the leading edge of a T(J) signal, edge generator A(N) produces a brief positive-going pulse briefly turning on transistor QN(J). Transistor QN(J) thereupon drives the TIMING signal to a low logic level. The pulse width of the edge generator output signal should be less than 1/Nth of the period of the T(J) signal where N is the number of tap signals.

Bistable latch circuit 23 consists of a pair of inverters I1,I2. The output of inverter I1 is tied to the input of inverter I2. The input of inverter I1 and the output of inverter I2 are tied to output node 26. Inverters I1,I2 are made of relatively weak transistors while transistors QP(1)–QP(N) and QN(1)–QN(N) are relatively strong. When any set circuit 19(I) momentarily pulls up node 26, inverter I1 drives its output low and inverter I2 drives its output high so that when the set circuit subsequently stops coupling tying node 26 to VDD, inverter I2 continues to hold node 26 high. Conversely, when any reset circuit 20(I) momentarily pulls down node 26, inverter I1 drives its output high and inverter I2 drives its output low so that when the reset circuit stops pulling node 26 down, inverter I2 continues to pull node 26 down. Bistable circuit 23 thus maintains TIMING signal at node 26 at its current logic level when none of the set or reset circuits 19,20 are actively driving the node.

For example, when set bit SE(2) is asserted during a CLOCK signal cycle, set circuit 19(2) responds to the leading edge of a reference signal T(2) pulse by briefly turning on transistor QP(2), thereby coupling node 26 to VDD and driving the TIMING signal high. On the leading edge of the TIMING signal pulse, the output of inverter I1 goes low and the output of inverter I2 goes high. Thereafter inverter I2 thus continues to hold the TIMING signal at node 26 to the high logic level until it is pulled low again by one of transistors QN(1)–QN(N).

Conversely, when reset bit RE(2) is asserted during a CLOCK signal cycle, reset circuit 20(2) responds to the leading edge of a reference signal T(2) pulse by briefly turning on transistor QN(2), thereby coupling node 26 to VSS and driving the TIMING signal low. As the TIMING signal goes low, the output of inverter I1 goes high and the output of inverter I2 goes low. On the trailing edge of the T(2) reference signal pulse, transistor QN(2) of reset circuit 20(2) turns off, disconnecting output node 26 from VSS. Inverter I2 thereafter continues to hold the TIMING signal at node 26 to the low logic level until node 26 is subsequently pulled to a high logic level by one of set circuits 19(1)–19(N).

Thus logic circuit 21 controls the timing of TIMING signal pulses by producing a sequence of DATA_OUT words, each DATA_OUT word of the sequence being produced in response to each pulse of the CLOCK signal. Since leading edges of the reference signals T(1)–T(N) evenly divide the period of the CLOCK signal into N intervals, the DATA_OUT sequence controls the timing of TIMING signal pulses with a resolution that is 1/Nth of the period of the reference clock signal. It should be noted that DATA_OUT words supplied to the set signals SE(1)–SE(N) and reset signals RE(1)–RE(N) controlling the set and reset circuits 19,20 should not be programmed to allow set and reset circuits to concurrently try to pull node 26 both up and down. That is, corresponding SE(J) and RE(J) bits in any one DATA_OUT word should not be concurrently set.

Figure 2A:
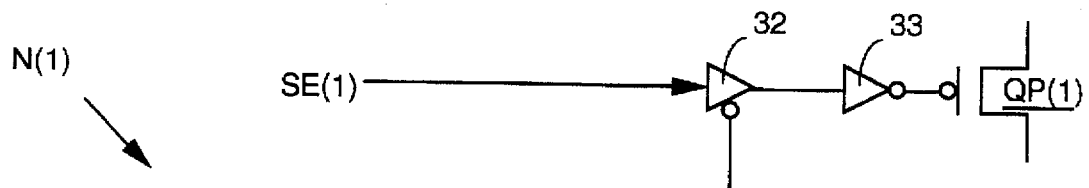
FIG. 2A illustrates a typical edge-generating NAND gate of FIG. 1.

FIG. 2A illustrates edge generator N(1) and transistor QP(1) of FIG. 1 in more detailed form. Edge generators N(2)–N(N) are similar to N(1). Edge generator N(1) includes a series of inverters 30, a NAND gate 31, a tri-state buffer 32, and an inverter 33. Timing signal T(1) is supplied directly to an input of NAND gate 31 and indirectly to another input of NAND gate 31 via inverters 30. A sufficient number of inverters 30 are provided to delay the arrival of T(1) at the NAND gate's second input by nearly ½ cycle of T(1) so that the two inputs of NAND gate 31 are concurrently high only briefly. Thus NAND gate 31 generates a short negative-going output pulse during each cycle of T(1)

briefly enabling tri-state buffer 32. Buffer 32 connects the set enable signal SE(1) to inverter 33. If SE(1) is high while buffer 32 is enabled, inverter 33 produces a short negative-going pulse strobing the gate of transistor QP1 and briefly turning QP(1) on. Inverter 33 is biased so that when buffer 32 is tri-stated, inverter 33 pulls up on the gate of transistor QP(1) to keep QP(1) off.

Figure 2B:
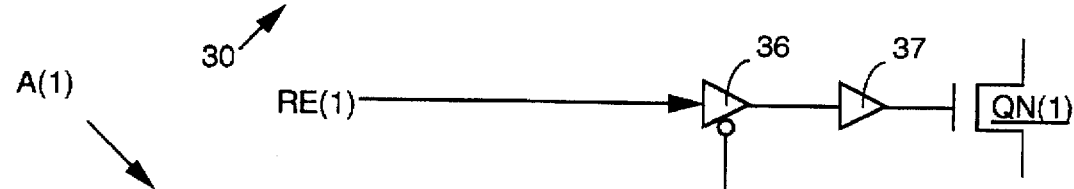
FIG. 2B illustrates a typical edge-generating AND gate of FIG. 1.

FIG. 2B illustrates edge generator A(1) and transistor QN(1) of FIG. 1 in more detailed form. Edge generators A(2)–A(N) are similar to A(1). Edge generator A(1) includes a series of inverters 34, a NAND gate 35, a tri-state buffer 36 and an amplifier 37. Timing signal T(1) is supplied directly to an input of NAND gate 35 and indirectly to another input of NAND gate 35 via inverters 34. NAND gate 38 generates a short negative-going output pulse during each cycle of T(1) briefly enabling tri-state buffer 36. Buffer 36 connects the reset enable signal RE(l) to amplifier 37. If SE(1) is high while buffer 32 is enabled, amplifier 37 produces a short positive-going pulse strobing the gate of transistor QN1 and briefly turning QN(1) on. Amplifier 37 is biased so that when buffer 36 is tri-stated, amplifier 37 pulls down on the gate of transistor QN(1) to keep QN(1) off.

Figure 3:
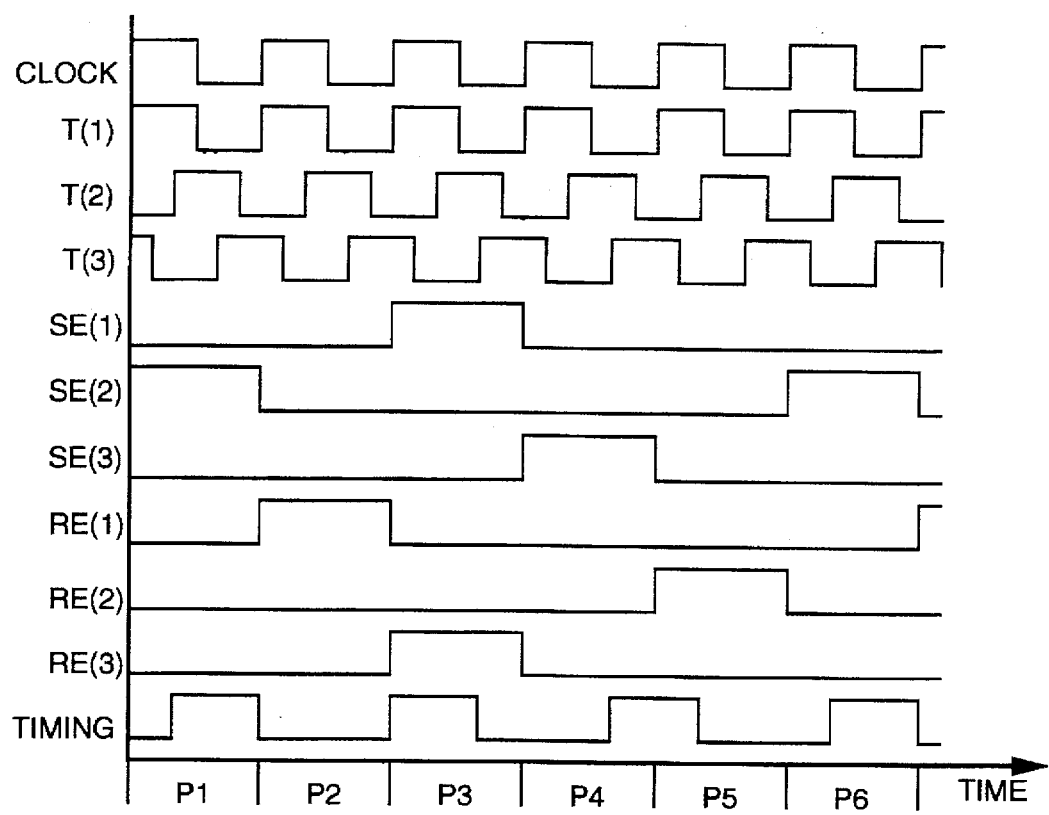
FIG. 3 is a timing diagram illustrating operation of the circuit of FIG. 1 when programmed for producing a simple periodic output signal.

By appropriately choosing the DATA_OUT sequence a user can program timing signal generator 21 to produce any of a wide variety of TIMING signal patterns. FIG. 3 is a timing diagram illustrating the operation of the timing signal generator 10 of FIG. 1. in a simplified example where N=3. In this example the desired output TIMING signal has a period 5/3 that of the CLOCK signal. During a first CLOCK signal period P1 only bit SE(2) is asserted. With SE(2) high, set circuit 19(1) drives the TIMING signal high in response to a leading edge of a reference signal T(2) pulse. During a second CLOCK signal period P2, control bit RE(l) is asserted and reset circuit 20(1) drives the TIMING signal low in response to the leading edge of a pulse of reference signal T(1). During CLOCK signal period P3 control bits SE(1) and RE(3) are both asserted. Set circuit 19(1) initially drives the TIMING signal high in response to the T(1) signal pulse and reset circuit 19(3) later drives the TIMING signal low again in response to the T(3) signal pulse. During CLOCK signal period P4 enable signal SE(3) is asserted and set circuit 19(3) drives the TIMING signal high in response to a reference signal T(3) pulse. During CLOCK signal period P5, enable signal RE(2) is asserted and reset circuit RE(2) drives the TIMING signal low in response to reference signal T(2) pulse. Starting at period P6, the control signal pattern appearing in periods P1–P5 is repeated. Thus it may be seen that for generator 10 to generate the output TIMING signal pattern of FIG. 2 logic circuit 21 must be programmed to produce a DATA_OUT sequence that repeats every five cycles of the CLOCK signal.

Figure 4:
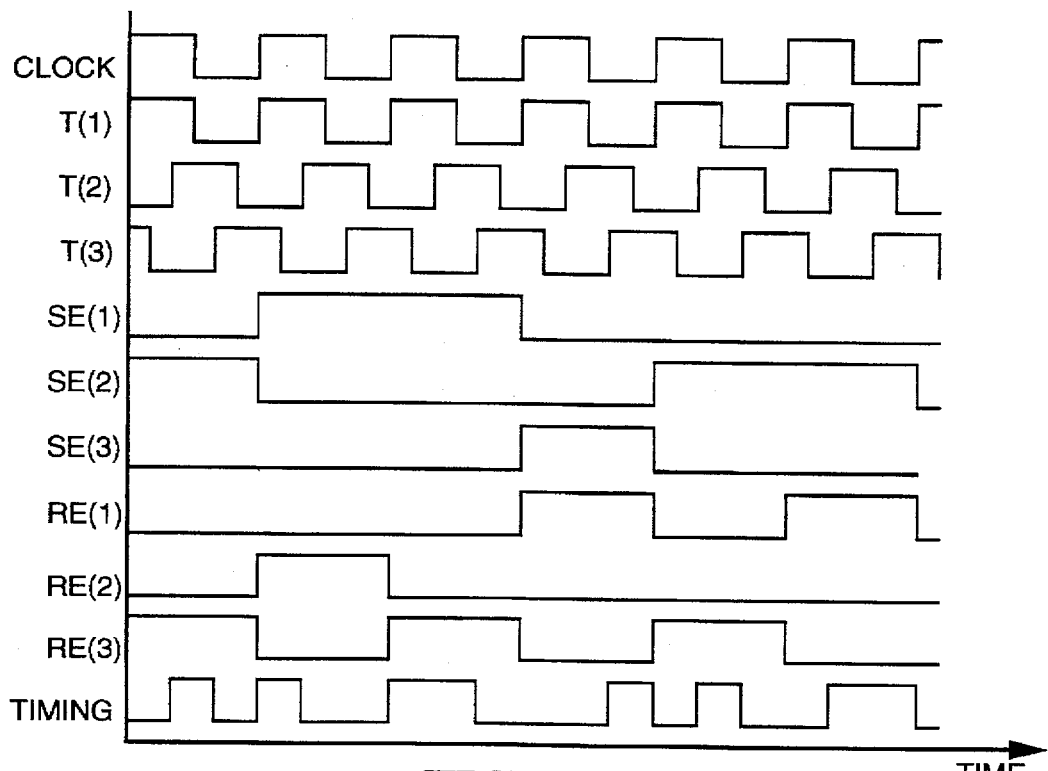
FIG. 4 is a timing diagram illustrating operation of the circuit of FIG. 1 when programmed for producing a complex periodic output signal.

FIG. 4 is a timing diagram illustrating operation of the timing signal generator 10 of FIG. 1 when programmed to produce a more complex TIMING signal having a period that is 10/3 that of the CLOCK signal period providing two short pulses and one long pulse each cycle. For generator circuit 10 to produce a TIMING signal output having this pattern, logic circuit 21 must be programmed to produce a DATA_OUT sequence repeating every 10 cycles of the CLOCK signal. For simplicity, only the data out sequence bits SE(1)–SE(3) and RE(1)–RE(3) for the first six cycles of the CLOCK signal are illustrated in FIG. 4.

Referring to FIG. 1, ring oscillator 14 suitably comprises a set of N identical inverters 28(1)–28(N) connected in series to form a ring. The PLL controller 16 supplies a power signal VPL to inverters 28 for controlling their switching speed. The CLOCK signal output of source 12 and the T(1) reference signal output of oscillator 14 are supplied as inputs to PLL controller 16. Controller 16 increases VPL when T(1) lags the CLOCK signal and decreases VPL when T(1) leads the CLOCK signal thereby to bring T(1) into phase with CLOCK. With inverters 28 being identical, and reference signal T(1) phase locked to the CLOCK signal, pulses of reference signals T(1)–T(N) appearing at the outputs of inverters 28 will be evenly distributed in time throughout each period of the CLOCK signal. Phase lock loop controllers suitable for use as PLL controller 16 are well known to those skilled in the art.

Referring again to FIG. 1, in the preferred embodiment, programmable logic circuit 21 includes a counter 22 and a memory 24. Counter 22 includes an internal register for receiving and storing input data value LIMIT indicating the length of the DATA_OUT word sequence. Counter 22 counts pulses of the CLOCK signal and produces binary data ADDR_OUT representing the number of pulses counted. When the ADDR_OUT data reaches the value of LIMIT, counter 22 resets its output count to zero. Logic circuit 21 includes a 2N-bit addressable random access memory 24. An input read/write control signal indicates whether memory 24 is read or write accessed. The DATA_OUT sequence is defined by writing control words into memory 24 at the first M memory addresses where M is the value of LIMIT. A user may write a control word to an address in memory 24 by placing the control word on set of data input lines DATA_IN, placing the address on a set of data address lines ADDR_IN and asserting the R/W signal. When the R/W signal is not asserted, memory 24 is in its read mode and is addressed by the ADDR_OUT output of counter 22. On each pulse of the CLOCK signal counter 22 increments ADDR_OUT to increment the current address of memory 24. In the read mode, memory 24 responds by reading out the 2N-bit parallel DATA_OUT word stored at the new address.

Figure 5:
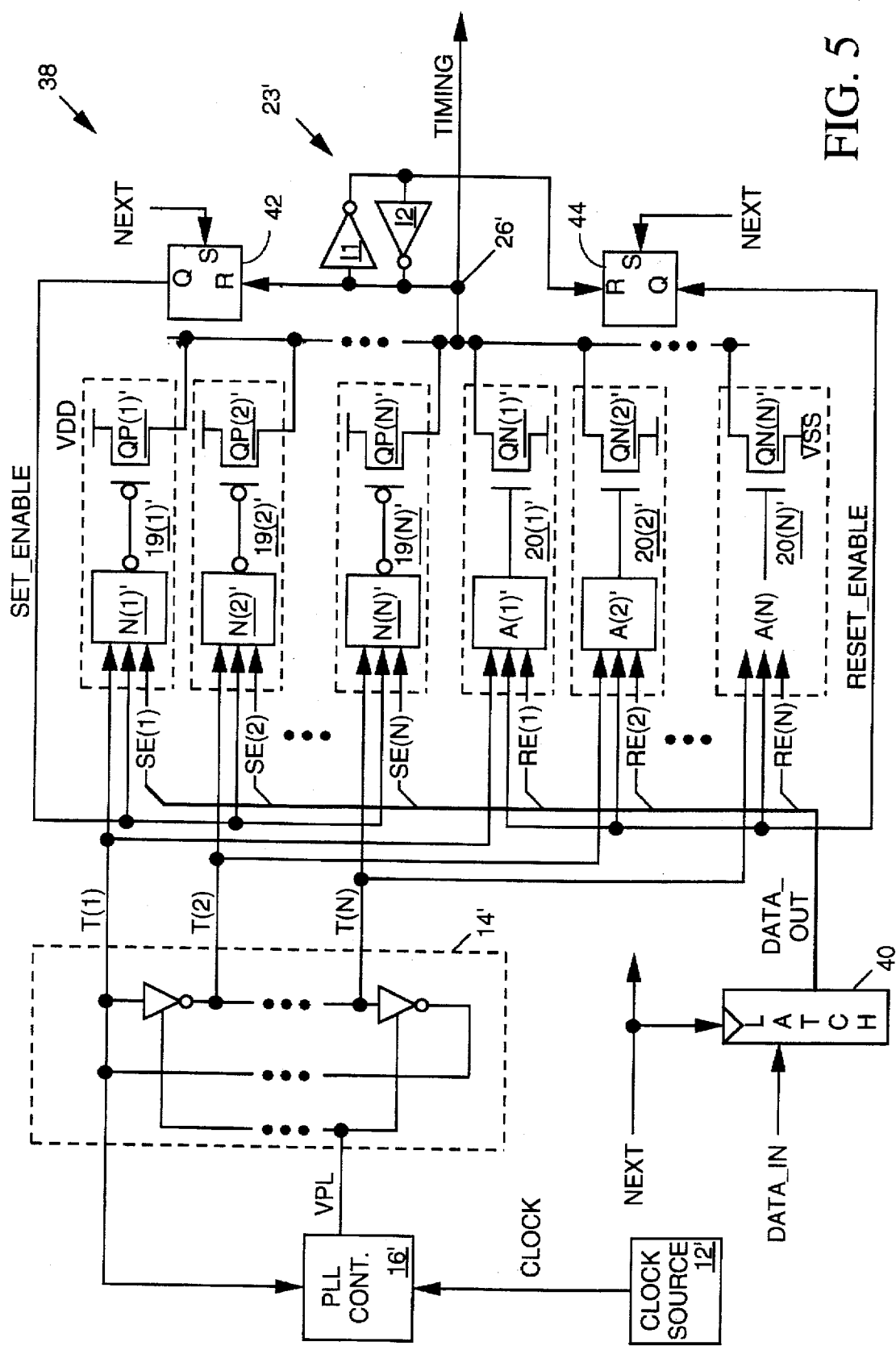
FIG. 5 illustrates in block diagram form a timing signal generator in accordance with an alternative embodiment of the present invention.

FIG. 5 illustrates in block diagram form a timing signal generator 30 in accordance with an alternative embodiment of the present invention. While generator 10 of FIG. 1 produces a periodic TIMING signal output, generator 38 of FIG. 5 produces a single TIMING single output pulse at a precise time following each pulse of an externally generated "NEXT" signal. Generator 38 includes clock signal source 12', a ring oscillator 14', a phase lock loop (PLL) controller 16', N set circuits 19(1)'–19(N)', N reset circuits 20(1)'–20(N)', a latch a bistable latch circuit 23' and a latch 40.

Devices 12', 14', 16' and 23' are similar to devices 12, 14 16 and 23 of FIG. 1. Latch 40 of FIG. 4 replaces programmable logic circuit 21 of FIG. 1 but has a similar function, providing 2N-bit DATA_OUT words to the set and reset circuits 19', 20'. However latch 40 simply latches an input 2N-bit DATA_IN word from an external controller and onto the DATA_OUT bus in response to each pulse of a NEXT signal provided by the external controller.

Each set circuit 19(J)' includes a edge generator N(J)' and a pmos transistor QP(J)'. The edge generator N(J)' of each set circuit 19(J)' has three inputs: the SE(J) bit of the DATA_OUT word, the T(J) reference signal and a SET_ENABLE bit provided by the Q output of a flip-flop 42. When all three of its inputs are high, edge generator N(J) pulls down the gate of pmos transistor QP(J) to couple output node 26' to VDD, thereby driving the output TIMING signal to a high logic level state.

Each reset circuit 20(J)' includes an edge generator A(J)' and a pmos transistor QN(J)'. The edge generator A(J)' of each reset circuit 20(J)' also has three inputs: the RE(J) bit of the DATA_OUT word, the T(J) reference signal and a RESET_ENABLE bit provided by the Q output of a flip-flop 44. When all three of its inputs are high, edge generator A(J) pulls up the gate of pmos transistor QN(J) to couple output node 26' to VSS, thereby driving the output TIMING signal to a low logic level state.

Bistable latch 23', consisting of inverters I1' and I2' latches the TIMING signal to its current high or low logic level depending on whether node 26' was last connected to VDD or VSS. The output of inverter I2', which drives node 26', also drives the reset input of flip-flop 42. The output of inverter I1', drives the reset input of flip-flop 44. The NEXT signal drives the set inputs of flip-flops 42 and 44.

The NEXT signal tells latch 40 to latch an input DATA_IN word onto the DATA_OUT bus and also sets flip-flops 42 and 44 driving the SET_ENABLE and RESET_ENABLE signals high. If a set bit SE(J) of the DATA_IN word is high while SET_ENABLE is high, then on the leading edge of a next pulse of reference signal T(J), edge generator N(J)' will turn on transistor QP(J)', thereby coupling node 26' to VDD and driving the TIMING signal high. As the TIMING signal goes high, flip-flop 42 resets, driving SET_ENABLE low. All edge generators N(1)'–N(N)' are thereafter inhibited from responding to reference signals T(1)–T(N) until a next pulse of the NEXT signal.

Similarly, if a reset bit RE(J) of the DATA_IN word is high while RESET_ENABLE is high, then on the leading edge of a next pulse of reference signal T(J), edge generator A(J)' will turn on transistor QN(J)', thereby coupling node 26' to VSS and driving the TIMING signal low. As the TIMING signal goes low, it drives the output of inverter I1' high resetting flip-flop 44 and driving RESET_ENABLE low. All edge generators A(1)'A(N)' are thereafter inhibited from responding to reference signals T(1)–T(N) until a next pulse of the NEXT signal.

Thus after each pulse of the NEXT signal, the timing signal generator 38 may pulse the TIMING signal once. The timing of leading and trailing edges of TIMING signal pulses are determined by the DATA_IN word input to latch 40 at the moment it received the NEXT signal pulse.

Figure 6A:
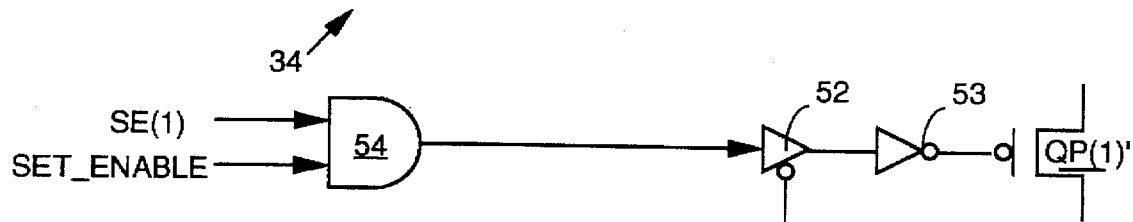
FIG. 6A illustrates a typical edge-generating NAND gate of FIG. 5.

FIG. 6A illustrates edge generator N(1)' and transistor QP(1)' of FIG. 5 in more detailed form. Edge generators N(2)'–N(N)' are similar to N(1)' Edge generator N(1) includes a series of inverters 50, NAND gate 51, AND gate 54, a tri-state buffer 52, and an inverter 53. Timing signal T(1) is supplied directly to an input of NAND gate 51 and indirectly to another input of NAND gate 51 via inverters 50. A sufficient number of inverters 50 are provided to delay the arrival of T(1) at the second input of NAND gate 51 by nearly ½ cycle of T(1) so that the two inputs of NAND gate 51 are concurrently high only briefly. Thus NAND gate 51 generates a short negative-going output pulse during each cycle of T(1) briefly enabling tri-state buffer 52. Buffer 52 connects the output of AND gate 54 to inverter 33. The SE(1) and SET_ENABLE signals drive inputs of AND gate 54. When SE(1) SET_ENABLE are high while buffer 54 is enabled, inverter 53 produces a short negative-going pulse strobing the gate of transistor QN1' and briefly turning QN(1)' on. Inverter 53 is biased so that when buffer 52 is tri-stated, inverter 53 pulls up on the gate of transistor QP(1)' to keep QP(1)' off.

Figure 6B:
FIG. 6B illustrates a typical edge-generating AND gate of FIG. 5.

FIG. 6B illustrates edge generator A(1)' and transistor QN(1)' of FIG. 5 in more detailed form. Edge generators A(2)'–A(N)' are similar to A(1)'. Edge generator A(1)' includes a series of inverters 64, a NAND gate 65, a tri-state buffer 66, an amplifier 67 and a NAND gate 68. Timing signal T(1) is supplied directly to an input of NAND gate 65 and indirectly to another input of NAND gate 65 via inverters 64. NAND gate 65 generates a short negative-going output pulse during each cycle of T(1) briefly enabling tri-state buffer 66. Buffer 36 connects the output of NAND gate 68 to amplifier 37. NAND gate 68 receives the RE(I) and RESET_ENABLE signals. If SE(1) and RESET_ENABLE are both high while buffer 66 is enabled, amplifier 67 produces a short positive-going pulse strobing the gate of transistor QN(1)' and briefly turning it on. Amplifier 67 is biased so that when buffer 66 is tri-stated, amplifier 67 pulls down on the gate of transistor QN(1)' to keep QN(1)' off.

Figure 7:
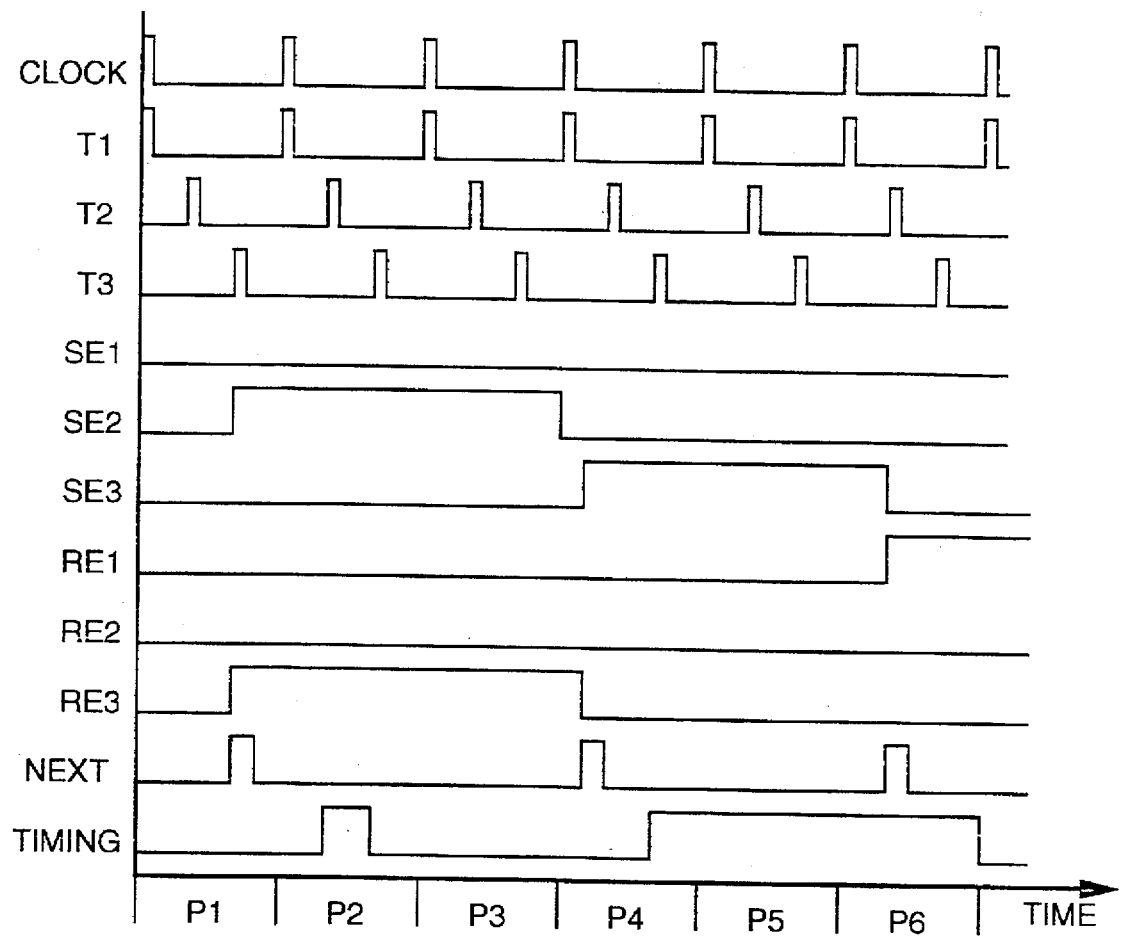
FIG. 7 is a timing diagram illustrating operation of the circuit of FIG. 5.

FIG. 7 is a timing diagram illustrating operation of the circuit of FIG. 5 for a simplified example where N=3, where the user has set DATA_IN so that only SE(2) and RE(3) are asserted. Referring to FIGS. 7 and 5, when an external controller pulses the NEXT signal input to latch 40 during period P1, latch 40 supplies an input DATA_IN word as a DATA_OUT word in which bits SE(2) and RE(3) are high. On the next reference signal T(2) pulse, which occurs during period P2, the TIMING signal is driven high. Thereafter, on the next reference signal T(3) pulse, the TIMING signal is driven low. Later, during period P4, the external controller, having altered DATA_IN so that only bit SE(3) is high, the external controller again pulses the NEXT signal. The TIMING signal is then driven high in response to a T(3) pulse. Still later, during period P6, the external controller again pulses the NEXT signal after having supplied a new DATA_IN value to latch 40 in which only bit RE(l) is high. Thereafter, on the next T(1) pulse, the TIMING signal is driven low. The timing signal generator circuit 38 of FIG. 5 therefore produces non-periodic TIMING signal pulses wherein an external controller controls the timing and width of the pulses by supplying appropriate DATA_IN words to latch 40 and appropriately timing pulses of the NEXT signal.

Thus has been shown and described preferred and alternative embodiments of a timing signal generator for producing a user-defined periodic and non-periodic timing signals with pulses timed in relation to a reference clock signal. In either embodiment the user controls the timing of signal pulses with a resolution finer than the period of the reference clock.

While the forgoing specification has described preferred and alternative embodiments of the present invention, one skilled in the art may make many modifications to the preferred embodiment without departing form the invention in its broader aspects. The appended claims therefore are intended to cover all such modifications as fall within the true scope and spirit of the invention.

We claim:

1. An apparatus for generating a timing signal at an output node comprising:

means for generating a clock signal;

means for receiving the clock signal and producing N periodic reference signals distributed in phase and frequency locked to the clock signal where N is greater than 1;

a first source of high logic level voltage;

a second source of low logic level voltage;

means for generating a set of N set signals and a set of N reset signals;

a set of N set circuits, each receiving a separate one of said N set signals, each receiving a separate one of said N reference signals, and each coupling said output node to said first source in response to a pulse of its received reference signal when its received set signal is asserted; and a set of N reset circuits, each receiving a separate one of said N reset signals, each receiving a separate one of said N reference signals, and each coupling said output node to said second source in response to a pulse of its received reference signal when its received reset signal is asserted.

2. The apparatus in accordance with claim 1 further comprising bistable circuit means connected to the output node for sensing a logic level voltage of said output node when said output node is coupled to either of said first and second sources and for maintaining the output node at the sensed logic level voltage when the output node is no longer coupled to either of said first and second sources.

3. The apparatus in accordance with claim 1 wherein at least one of said set circuits comprises:

first edge generator means receiving one of said set signals and one of said reference signals and producing a first output signal pulse in response to an edge of a pulse of said one of said reference signals when said one of said set signals is asserted, and a first transistor for receiving the first output signal pulse and providing a signal path between said first source and said output node on receipt of the first output signal pulse.

4. The apparatus in accordance with claim 3 wherein at least one of said reset circuits comprises:

second edge generator means receiving one of said reset signals and one of said reference signals and producing a first output signal pulse in response to an edge of a pulse of said one of said reference signals when said one of said reset signals is asserted, and a second transistor for receiving the second output signal pulse and providing a signal path between said second source and said output node upon receipt of the second output signal pulse.

5. The apparatus in accordance with claim 1 wherein said means for generating said set of N set signals and said set of N reset signals comprises means for storing a sequence of multiple bit data words, for sequentially reading out the stored data words, and for generating said set and reset signals, wherein separate bits of each read out data word control assertion of separate ones of said set and reset signals.

6. The apparatus in accordance with claim 1 wherein said means for generating said set of N set signals and said set of N reset signals comprises:

means for receiving pulses of said clock signal and producing an output count of said pulses; and memory means addressed by said output count for storing a sequence of multiple bit data words at successive addresses and for reading out each of said data words when addressed by said count, bits of each read out data word forming said set and reset signals.

7. The apparatus in accordance with claim 1 wherein said means for receiving the clock signal and producing N periodic reference signals distributed in phase and frequency locked to the clock signal comprises:

a ring oscillator for producing said set of reference signals distributed in phase, the reference signals having a frequency controlled by an input frequency control signal; and a phase locked loop controller receiving said clock signal and one of said reference signals for adjusting said frequency control signal such that said one of said reference signals is phase locked to said clock signal.

8. An apparatus for generating a timing signal pulse at an output node in timed response to a pulse of an input signal comprising:

means for generating a clock signal;

means for receiving the clock signal and producing N periodic reference signals distributed in phase and frequency locked to the clock signal where N is greater than 1;

a first source of high logic level voltage;

a second source of low logic level voltage;

means for generating a set of N set signals and a set of N reset signals;

a set of N set circuits, each receiving a separate one of said N set signals, each receiving a separate one of said N reference signals, each receiving a set enable signal, and each coupling said output node to said first source in response to a pulse of its received reference signal when its received set signal is asserted;

a set of N reset circuits, each receiving a separate one of said N reset signals, each receiving a separate one of said N reference signals, each receiving a reset enable signal, and each coupling said output node to said second source in response to a pulse of its received reference signal when its received reset signal is asserted; and means for generating said set enable and reset enable signals.

9. The apparatus in accordance with claim 8 further comprising bistable circuit means connected to the output node for sensing a logic level of said output node when said output node is connected to either of said first and second sources and for maintaining the output node at the sensed logic level when the output node is no longer connected to either of said first and second sources.

10. The apparatus in accordance with claim 8 wherein at least one of said set circuits comprises:

first edge generator means receiving one of said set signals, one of said reference signals and said set enable signal, and producing a first output signal pulse in response to an edge of a pulse of said one of said reference signals when said set enable and one of said set signals are concurrently asserted, and reference and set enable signals are concurrently asserted; and a first transistor for receiving the first output signal pulse and providing a signal path between said first source and said output node upon receipt of the first output signal pulse.

11. The apparatus in accordance with claim 10 wherein at least one of said reset circuits comprises:

second edge generator means receiving one of said reset signals, one of said reference signals and said reset enable signal, and producing a second output signal pulse in response to an edge of a pulse of said one of said reference signals when said reset enable and one of said reset signals are concurrently asserted; and a second transistor for receiving the second output signal pulse and providing a signal path between said second source and said output node upon receipt of the second output signal pulse.

12. The apparatus in accordance with claim 8 wherein said means for generating said set of N set signals and said set of N reset signals comprises means for storing an input data word in response to a pulse of said input signal and for generating said set and reset signals, wherein separate bits of the stored data word control assertion of separate ones of said set and reset signals.

13. The apparatus in accordance with claim 8 wherein said means for receiving the clock signal and producing N periodic reference signals distributed in phase and frequency locked to the clock signal comprises:

a ring oscillator for producing said set of reference signals distributed in phase, the reference signals having a frequency controlled by an input frequency control signal; and a phase locked loop controller receiving said clock signal and one of said reference signals for adjusting said frequency control signal such that said one of said reference signals is phase locked to said clock signal.

14. The apparatus in accordance with claim 8 wherein said means for generating said set enable signals and said reset enable signals comprises means responsive to said timing signal and to said input signal for asserting said set enable and reset enable signals in response to said input signal, for deasserting said set_enable signal when said output node is coupled to said high logic level voltage, and for deasserting said reset enable signal when output node is coupled to said low logic level voltage.

15. An apparatus for generating a timing signal at an output node comprising: means for generating a clock signal;

a voltage controlled oscillator for producing a set of N reference signals distributed in phase where N is greater than 1, the reference signals having a frequency controlled by an input frequency control signal; and a phase locked loop controller receiving said clock signal and one of said reference signals for adjusting said frequency control signal such that said one of said reference signals is phase locked to said clock signal;

a first source of high logic level voltage;

a second source of low logic level voltage;

means for generating a sequence of data words, bits of each data word controlling assertion of a set of N set signals and a set of N reset signals, where N is greater than 1;

a set of N set circuits, each receiving a separate one of said N set signals, each receiving a separate one of said N reference signals, and each coupling said output node to said first source in response to an edge of its received reference signal when its set signal is asserted;

a set of N reset circuits, each receiving a separate one of said N reset signals, each receiving a separate one of said N reference signals, and each coupling said output node to said second source in response to an edge of its received reference signal when its received reset signal is asserted; and bistable circuit means connected to the output node for sensing a logic level voltage of said output node when said output node is coupled to either of said first and second sources and for maintaining the output node at the sensed logic level voltage when the output node is no longer coupled to either of said first and second sources.

16. The apparatus in accordance with claim 15 wherein at least one of said set circuits comprises:

first edge generator means receiving one of said set signals and one of said reference signals and producing a first output signal pulse in response to an edge of its received reference signal when its received set signal is asserted, and a first transistor for receiving the first output signal pulse and providing a signal path between said first source and said output node upon receipt of the first output signal pulse.

17. The apparatus in accordance with claim 16 wherein at least one of said reset circuits comprises:

second edge generator means receiving one of said reset signals and one of said reference signals and producing a second output signal pulse in response to an edge of its received reference signal when its received reset signal is asserted, and a second transistor receiving the second output signal pulse and providing a signal path between said second source and said output node upon receipt of the second output signal pulse.

18. An apparatus for generating a timing signal pulse at an output node in timed response to a pulse of an input signal comprising:

means for generating a clock signal;

a ring oscillator for producing a set of N periodic reference signals distributed in phase, the reference signals having a frequency controlled by an input frequency control signal;

a phase locked loop controller receiving said clock signal and one of said reference signals for adjusting said frequency control signal such that said one of said reference signals is phase locked to said clock signal;

a first source of high logic level voltage;

a second source of low logic level voltage;

means for storing an input data word in response to a pulse of said input signal and for generating a set of N set signals and a set of N reset signals, wherein separate bits of the stored data word control assertion of separate ones of said set and reset signals;

a set of N set circuits, each receiving a separate one of said N set signals, each receiving a separate one of said N reference signals, each receiving a set enable signal, and each coupling said output node to said first source in response to an edge of its received reference signal when its received set and set enable signals are concurrently asserted;

a set of N reset circuits, each receiving a separate one of said N reset signals, each receiving a separate one of said N reference signals, each receiving a reset enable signal, and each coupling said output node to said second source in response to an edge of its received reference signal when its received reset and reset enable signals are concurrently asserted;

means responsive to said timing signal and to said input signal for asserting said set enable and reset enable signals when said input signal is asserted, for deasserting said set enable signal when said output node is coupled to said high logic level voltage, and for deasserting said reset enable signal when output node is coupled to said low logic level voltage; and bistable circuit means connected to the output node for sensing a logic level of said output node when said output node is connected to either of said first and second sources and for maintaining the output node at the sensed logic level when the output node is no longer connected to either of said first and second sources.

19. The apparatus in accordance with claim 18 wherein at least one of said set circuits comprises:

first edge generator means receiving one of said set signals and one of said reference signals and producing a first output signal pulse in response to an edge of a pulse of said one of said reference signals when said one of said set signals is asserted, and a first transistor for receiving the first output signal pulse and providing a signal path between said first source and said output node on receipt of the first output signal pulse.

20. The apparatus in accordance with claim 19 wherein at least one of said reset circuits comprises:

second edge generator means receiving one of said reset signals and one of said reference signals and producing a first output signal pulse in response to an edge of a pulse of said one of said reference signals when said one of said reset signals is asserted, and a second transistor for receiving the second output signal pulse and providing a signal path between said second source and said output node upon receipt of the second output signal pulse.

* * * * *